(12) United States Patent
Hon et al.

(10) Patent No.: US 7,279,347 B2
(45) Date of Patent: Oct. 9, 2007

(54) METHOD FOR MANUFACTURING A LIGHT-EMITTING STRUCTURE OF A LIGHT-EMITTING DEVICE (LED)

(75) Inventors: Schang-Jing Hon, Pa Te (TW); Jenn-Bin Huang, Tai Chung Hsienm (TW)

(73) Assignee: Super Nova Optoelectronics Corp., Taipei (TW)

( * ) Notice: Subject to any disclaimer, the term of this patent is extended or adjusted under 35 U.S.C. 154(b) by 0 days.

(21) Appl. No.: 10/720,063

(22) Filed: Nov. 25, 2003

(65) Prior Publication Data

US 2004/0104398 A1 Jun. 3, 2004

(30) Foreign Application Priority Data

Nov. 25, 2002 (TW) ............................... 91134218 A (51) Int. Cl.
*H01L 21/00* (2006.01)

(52) U.S. Cl. .............................. 438/29; 438/39; 438/47

(58) Field of Classification Search .................. 438/39, 438/46, 47, 22, 27, 29
See application file for complete search history.

(56) References Cited

U.S. PATENT DOCUMENTS

2002/0117672 A1* 8/2002 Chu et al. ...................... 257/79
2004/0238832 A1* 12/2004 Takahashi et al. ............ 257/86

* cited by examiner

*Primary Examiner*—Minh-Loan Tran
(74) *Attorney, Agent, or Firm*—Troxell Law Office PLLC (57) ABSTRACT

A method for manufacturing a light-emitting structure of a light-emitting device (LED) is disclosed. The white colored LED includes a resonant cavity structure, producing and mixing lights which may mix into a white colored light in the resonant cavity structure, so that the white colored LED may be more accurately controlled in its generated white colored light, which efficiently reduces deficiency, generates natural white colored light and aids in luminous efficiency promotion. In addition to the resonant cavity structure, the light-emitting structure also includes a contact layer, an n-type metal electrode, and a p-type metal electrode.

6 Claims, 12 Drawing Sheets

METHOD FOR MANUFACTURING A LIGHT-EMITTING STRUCTURE OF A LIGHT-EMITTING DEVICE (LED)

BACKGROUND OF THE INVENTION

1. Field of the Invention

The present invention pertains to a light emitting device and a manufacturing method for a light-emitting device (LED), and particularly to a highly efficient light-emitting structure and a manufacturing method for an LED. In particular, the light-emitting structure proposed herein is based on the Group-III GaN-based materials and has a resonant cavity structure used to enhance luminous efficiency of the generated light therefrom.

2. Descriptoin of Related Art

Light-emitting devices (LEDs) have been developed and on the market for years and are useful in providing lights as generally recognized. The use of LEDs in digital watches and calculators are well known. As we see, it may also find other important applications in communications and other areas, such as mobile phone and some appliances. Recently, there is a trend that LEDs be further applied to ordinary human living utilization, such as large panels, traffic lights and lighting facilities and the perspective thereof are looking good. Therefore, LEDs are increasingly playing an important role in our daily life and deserving more efforts. As is transparent to those skilled in the art, LEDs are produced based on some semiconductor materials and emits lights by dint of the behaviors aroused in the semiconductor materials in the presence of an applied electrical bias.

In particular, an LED gives off a light by a light-emitting structure therein generally composed of some Group-III (compound) semiconductor owing to its stronger inclination of recombination of electrons and holes. In principle, an LED is basically a well-known p-n junction structured device, i.e., a device having a p region, an n region and a transient region therebetween. With a forward voltage or current bias applied, the majority of carriers in the p or n regions drift respectively towards the other region (through the transient region) in the device due to the energy equilibrium principle and a current is accounted for, in addition to the general thermal effects. When electrons and holes jumped into a higher value of energy band with the aid of electrical and thermal energy, the electrons and the holes recombine there and give off lights when they randomly and spontaneously fall back to a reduced energy state owing to thermal equilibrium principle, i.e. spontaneous emission.

Afterwards, the concept and structure widely used in semiconductor device of the multi-quantum well (MQW) layers are introduced into an LED structure. Generally, the MQW layers are formed between the p and the n regions in the above-mentioned p-and-n structure, which forms the so-called "PIN" structure. With the aid of the MQW active layers, the possibility of recombination of the electrons and holes in the p-n junction based device are efficiently enhanced and the luminous efficiency thereof is upgraded considerably. Further, the color of a light emitted from the LED may be controlled through a choice of the materials, dopant concentration and layer thickness in the MQW layers.

However, the current LEDs are still not sufficient in brightness in serving as some light supplying facilities, and which has long been the common issue that all researchers in the field concern and desire to address.

In view of the foregoing problem, the inventors of the present invention provides a novel colored light emitting diode with a different structure so as to increase luminous efficiency of the currently used LED.

SUMMARY OF THE INVENTION

Therefore, it is an object of the present invention to provide a light-emitting structure and its manufacturing method for an LED which may usefully enhance its luminous efficiency without largely increasing cost.

To achieve the object, the present invention provides a light-emitting structure for an LED, wherein the light-emitting structure comprises a resonant cavity. In one embodiment, the resonant cavity bordered by a lower reflecting component, p-GaN based distributed Bragg reflector (DBR) and an upper reflecting component, a metal reflector or an n-GaN based distributed Bragg reflector (DBR). Owing to the light resonation and the thus self-exciting of the emitted light in the LED device, the light out of the LED device is efficiently enhanced with a fixed electric power source.

To achieve the above-mentioned LED, the present invention also provides a manufacturing method for the light-emitting structure. In one embodiment, the method comprises forming a buffer layer over a substrate; forming an GaN based epitaxial layer over the buffer layer; forming an MQW active layer over the n-GaN based layer; forming a p-DBR over the MQW active layer; forming a p-GaN based epitaxial layer over the p-DBR and etching away a portion of the n-GaN based layer, the MQW active layer, the p-type DBR and the p-GaN based layer whereby an exposing region is formed on the n-GaN layer; and coating a metal reflector over a bottom side of the substrate.

Along with the high luminous efficiency, the resonant cavity utilizing the metal reflector as the lower reflecting element may efficiently reduce cost and simplify manufacturing process.

BRIEF DESCRIPTION OF THE DRAWINGS

To better understand the other features, technical concepts and objects of the present invention, one may read clearly the description of the following preferred embodiment and the accompanying drawings, in which.

DETAILED DESCRIPTION OF PREFERRED EMBODIMENTS

The present invention relates to an improved light-emitting structure for an LED in terms of luminous efficiency, wherein the light-emitting structure comprises a resonant cavity. In a preferred embodiment, the manufacturing method for a high efficiency light-emitting device (LED) device according to the present invention comprises the following steps. In appreciating the preferred embodiment, please refer directly to FIGS. 1 to 3, wherein the reference numerals given in the corresponding device are also used in the recitation of the steps.

Figure 1:
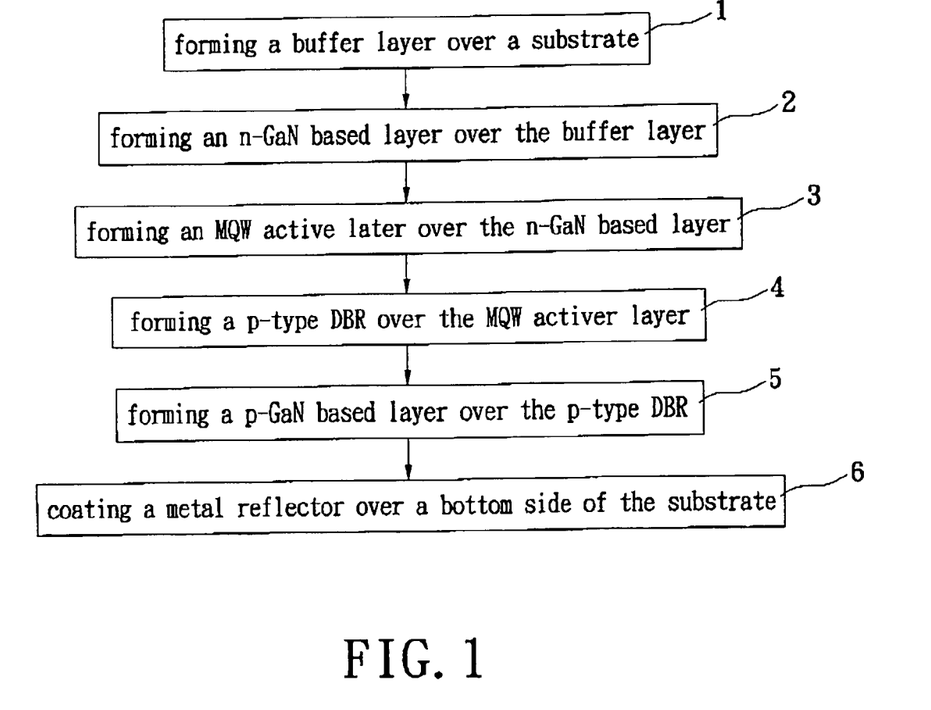
FIG. 1 depicts schematically a manufacturing method of a preferred embodiment according to the present invention.

Step 1: forming a buffer layer 11 over a substrate 10, i.e., forming a buffer layer 11 over an upper surface 10a of the substrate 10. The substrate 10 may be such as sapphire, silicon carbide (SiC) and gallium nitride (GaN) for the consideration that a GaN based material is chosen thereon, The buffer layer 11 may be composed of some layers depending on choice of design, such as a coarse grain nucleation layer made of GaN and an undoped GaN layer. The nucleation layer is a low temperature layer, i.e. formed under a low temperature condition, about 500–550° C.; has a thickness of 200–400 Å and will be referred to as an LT-GaN layer herein. The undoped GaN is a high temperature layer, formed under a temperature of 1020–1040° C. and has a thickness of 0.2–2 μm, and will be termed as an HT-GaN layer. These buffer layers may be formed by molecular beam epitaxy (MBE), metal organic chemical vapor deposition (MOCVD) and some other suitable technologies, currently in existence or set forth in the future. The application of the buffer layer 11 is aimed to lattice matching between the substrate and the epitaxial layer formed thereon, and some other reasons.

Step 2: forming an n-GaN based epitaxial layer 13 over the buffer layer 11. It may be executed by such as MBE and MOCVD. In forming such n-GaN based epitaxial layer, the temperature is 1020° C.–1040° C. and the formed thickness is 2–8 μm.

Step 3: forming an MQW active layer 14 over the n-GaN based epitaxial layer 13, wherein the MQW active layer 14 is chosen so that the MQW active layer 14 may generate a light with a wavelength from 380 nm to 600 nm.

Step 4: forming a p-type distributed Brag reflector (DBR) 15 over the MQW active layer 14. As well known to those persons skilled in the art, a DBR is a multi-layer structure formed for reflection of a light. In a preferred embodiment of the present invention, the p-type DBR 15 is AlGaN/GaN. The thickness thereof is 0.1–0.5 μm and the process temperature therefor is 960–1000° C. The reflectance of the p-type DBR may be chosen between 50 and 80%.

Step 5: forming a p-GaN based layer 16 over the p-type DBR 15 and etching away a portion of the n-GaN layer 13, the MQW active layer 14, the p-type DBR 15 and the p-GaN based layer 16 whereby the n-GaN layer 13 has an exposing region 13a and an n-type electrode 17 may be disposed over the exposing region 13a and a p-type electrode 18 may be disposed over the p-GaN layer 16. The p-GaN based layer 16 can be formed by such as MBE and MOCVD, under the process conditions of a temperature of 1020° C.–1040° C. and a thickness is 2–8 μm. On the other hand, the n- and p-type electrodes 17 and 18 may be formed by such as sputtering, vaporizing and E-gun technologies, and the adopted electrode material may be well-conductive metal of all appropriate kinds, such as aluminum and copper, and may preferably have good light transparency (to the light generated from the device, i.e., 380 nm to 600 nm), such as a thin Ni/Au layer (with the Ni layer formed first and the Au layer atop the Ni layer). It is to be noted that although the formations of the p-type and n-type electrodes 17, 18 are not recited in this step and FIG. 1, they are in effect formed successively. In terms of the p-type and n-type electrodes, all embodiments explained here will not present them in the corresponding drawings and description. As for the etching, it is not presented in the corresponding drawing, FIG. 1. The suitable etching method may be dry etching, such as chlorine plasma etching.

Step 6: coating a metal reflector 19 over a bottom side of the substrate 10. The coating method may be such as sputtering, vaporizing and E-gun technologies. In undertaking such a coating step, the bottom side of the substrate 10 may be polished to a reduced thickness, 50 μm to 300 μm, from a larger thickness and then coated with the metal reflector 19. The metal reflector 19 is made of a suitable metal so that a specified reflector, such as one having a desired reflectivity, may be achieved and the reflectivity may be over 90%. The metal coating layer 19 has a thickness of 50 Å to 10 μm and may be performed by electro-plating, sputtering and some other suitable technologies.

Figure 2:
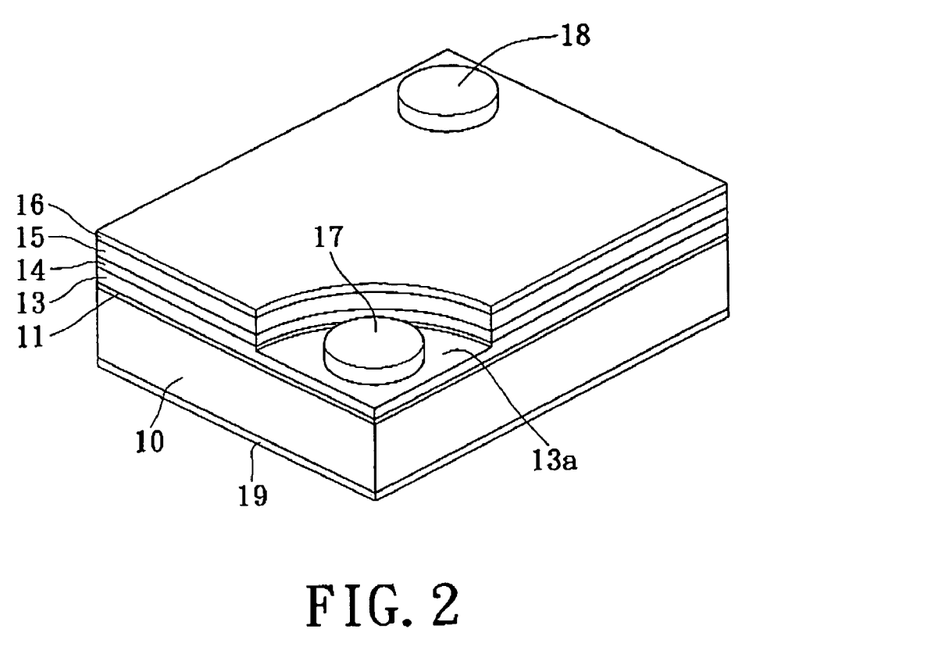
FIG. 2 depicts schematically a perspective diagram of a structure of a light-emitting structure of a preferred embodiment according to the present invention.
Figure 2A:
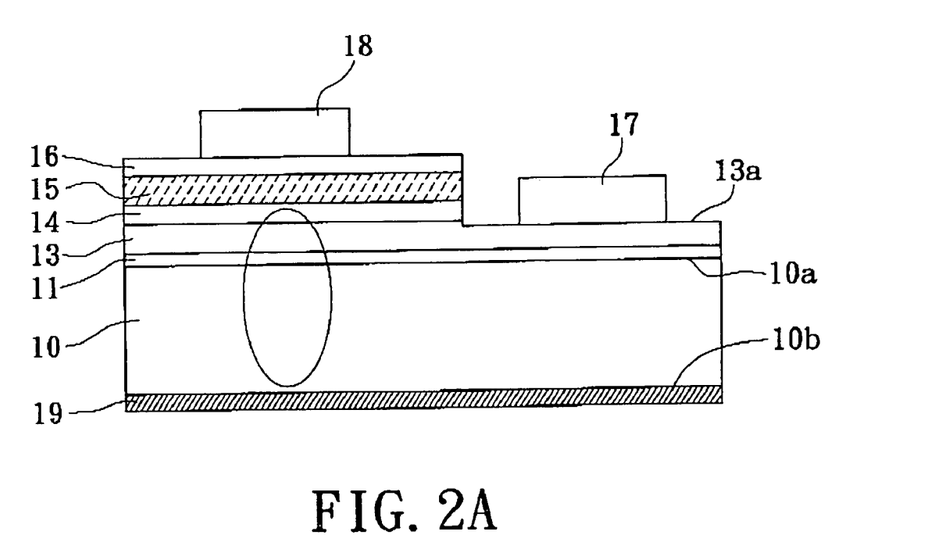

In FIGS. 2 and 2A, a light-emitting structure according to the preferred device embodiment of the present invention is recited which corresponds to the preferred method embodiment shown in FIG. 1. The light emitting device comprises a metal reflector 19, a substrate 10, a buffer layer 11, an n-GaN based layer 13, an MQW active layer 14, a p-type DBR 15, a contact layer 16, an n-type metal electrode 17 and a p-type metal electrode 18, wherein the region bordered by the two reflecting components, the metal reflector 19, and the p-type distributed Bragg reflector (DBR) 15 forms a resonant cavity. In the figure, the circle with arrows indicates the behavior of the light resonation in the resonant cavity, and that will hold for all drawings in the present invention. In the device, the substrate 10 may be such as sapphire, gallium nitride (GaN) and silicon carbide (SiC). The metal reflector 19 coated on a lower surface 10b of the substrate 10 has a reflectance of larger than 90%. The buffer layer 11 is provided as an intermediate layer between the substrate 10 and the MQW active layer 12 for some reasons, such as better lattice matching. As also described in the above, the buffer layer 11 may be composed of some layers. The MQW active layer 14 is chosen so that the layer 14 may generate a light having a wavelength of 380 nm to 600 nm once an electrical bias is fed into the LED device. The contact layer 16 is a p-GaN based layer and formed over the p-type DBR 15 for contact with a corresponding electrode 18. The p-type metal electrode 18 is disposed over the p-GaN layer 16 for electricity feed, while the n-type metal electrode 17 is disposed over an exposing region 13a of the n-GaN layer 13. The n-GaN based layer 13, the MQW layer 14 and the p-DBR layer 15 jointly form a P-I-N light generating unit, which is familiar to those persons skilled in the art and will not be explained here.

To obtain a specific color of the emitted light from the LED device, the MQW active layer 14 should be carefully chosen. In accordance with the generally known chromaticity diagram, when the MQW active layer emits a light with a wavelength of 465 nm to 485 nm upon an applied electric bias, the LED is a blue colored LED. When the MQW active layer 14 emits a light with a wavelength of 495 nm to 540 nm upon an applied electric bias, the LED is a green colored LED. When the MQW active layer 14 emits a light with a wavelength of 560 nm to 580 nm upon an applied electric bias the LED is a yellow colored LED. Of course, the MQW active layer 14 may emit a light having a wavelength between 380 nm-600 nm but other than the above range and become some other colored LED, which depends upon the choice of the MQW layer 14.

To completely form a marketed LED, wire bonding and packaging are necessary on the light-emitting structure. Since these steps are well known to those persons skilled in the art, the description of the related technology is omitted here.

Figure 3:
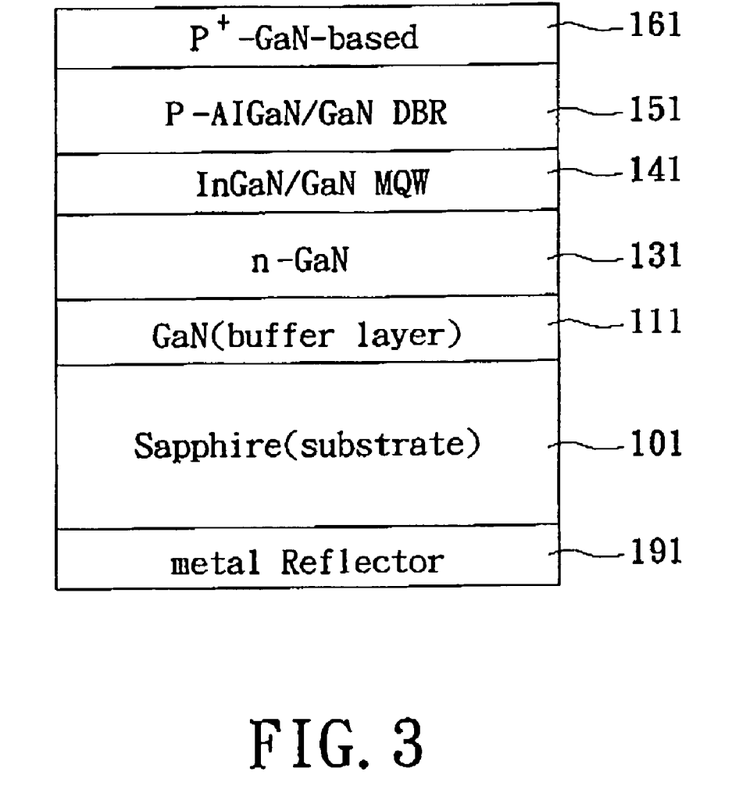
FIGS. 3 and 3A represent a particular example of the epitaxial structure shown in FIG. 2.
Figure 3A:
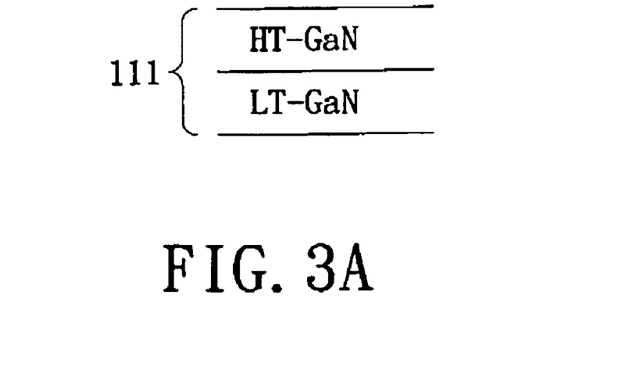

In FIGS. 3 and 3A, a particular example of the device depicted in FIG. 2 is shown. In the example, the first and second layers 111 are LT-GaN/HT-GaN buffer layers, in which the former has a thickness of 30–500 Å while the latter 0.2–0.5 μm. The third layer 131 is an n-GaN based semiconductor layer with a thickness of 2–6 μm. The fourth layer 141 is an InGaN/GaN MQW layer. The fifth layer 151 is a p-AlGaN/GaN DBR. The sixth layer 161 is p$^+$-GaN based semiconductor with a thickness of 0.2–0.5 μm, wherein the heavy dopant concentration of the sixth layer 161 is aimed at better ohmic contact with the upper metal electrode (not shown).

Lower to the above layers are a substrate 101 and a metal reflector 191, wherein the metal reflector 191 is coated below the substrate 101. Specifically, the substrate 101 may be sapphire, SiC or GaN. In manufacturing process, the substrate 101 first has a thickness of 300–500 μm in the process of the growth of those epitaxial layers over the substrate 101. After the epitaxial layers are formed, the substrate 101 is polished at its bottom side to a thickness of 50–300 μm and a metal reflector 191 is coated thereon. The metal reflector 191 may be Ag/Al, i.e., first coated with Ag and then Al so that Ag material will not expose, or Ag, or any other metal, and may have a thickness of 50 Å to 10 μm.

Figure 4:
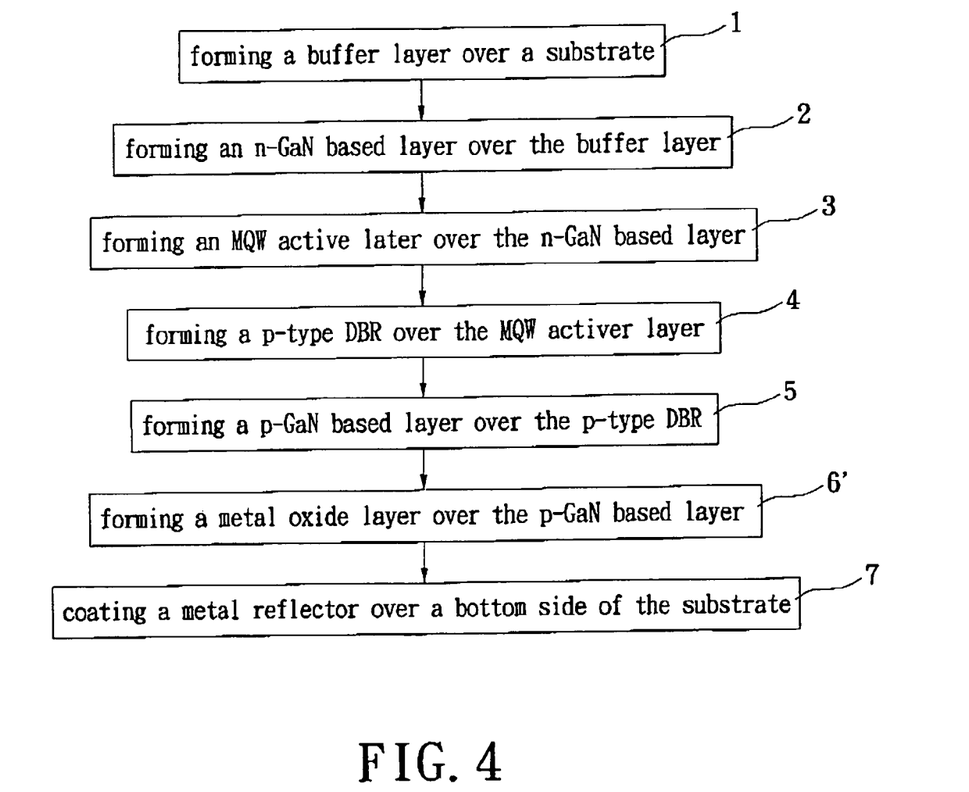
FIG. 4 depicts schematically a manufacturing method of a second embodiment according to the present invention.

Now the description will be made to a second method embodiment according to the present application, and please refer directly to FIG. 4. The second method embodiment is the same as the preferred embodiment except for the step, Step 6'. Step 6': coating a transparent contact layer (TCL) with a suitable thickness over the contact layer, p-GaN based layer, succeeding to Step 5. In terms of material used, the TCL may be made of Ni/Au and other suitable transparent (for the generated light from the light-emitting structure, such as a light with a wavelength of 380–600 nm) and conductive materials and may be an n-TCL (n-doped) or a p-TCL (p-doped). In fact, the TCL may be a doped metal oxide, such as doped ZnO, which may be referenced to U.S. patent application Ser. No. 10/700,536, filed on Nov. 5, 2003, now U.S. Pat. No. 6,992,331; and U.S. patent application Ser. No. 10/700,537, filed Nov. 5, 2005, currently pending, and co-pending with the present application and assigned to the same assignee of the present invention.

Figure 5:
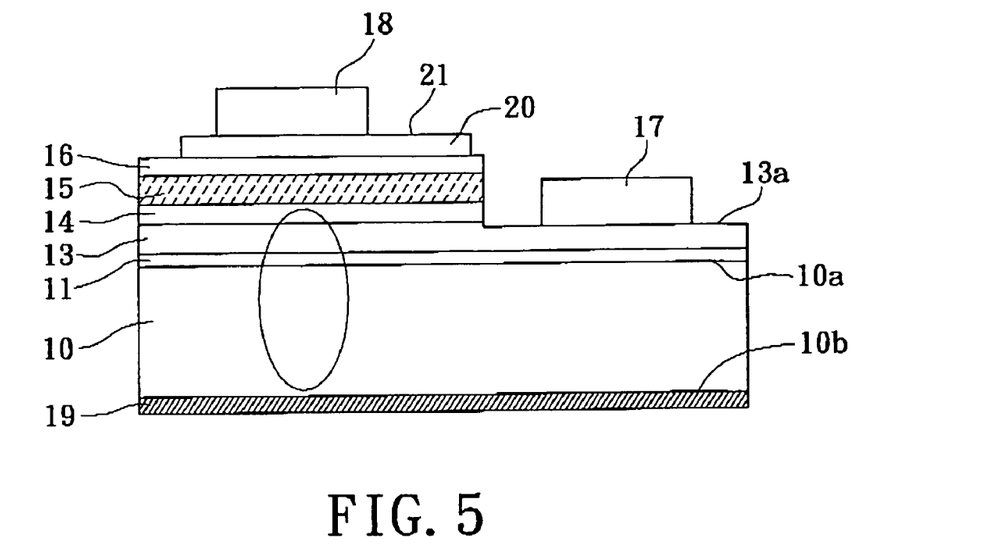
FIG. 5 depicts schematically a structure of a light-emitting structure of a second embodiment according to the present invention.
Figure 6:
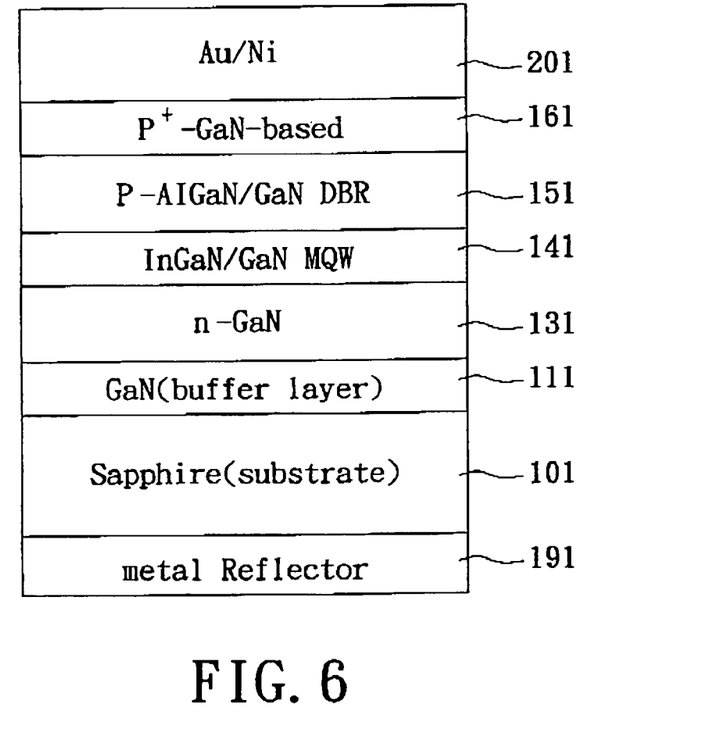
FIG. 6 depicts a particular example of the epitaxial structure shown in FIG. 5.

The second device embodiment according to the present invention is manufactured by the second method embodiment and provided schematically as FIG. 5. It is to be noted that the TCL 20 is added for compensating for the lower mobility of the majority of carriers, holes and uniformly spreading the electrical charges in the neighborhood of the p-type electrode 18 to the entire contact layer, p-GaN based layer 16, and thus promoting luminous efficiency of the device. Referring to FIG. 6, it illustrates a particular example of FIG. 5. As is with the p$^+$-GaN based layer 161 of FIG. 3, the p-GaN based layer 161 is also heavily doped for better ohmic contact with the upper metal electrode (not shown) and may be a p-InGaN or a p-AlInGaN layer.

Figure 7:
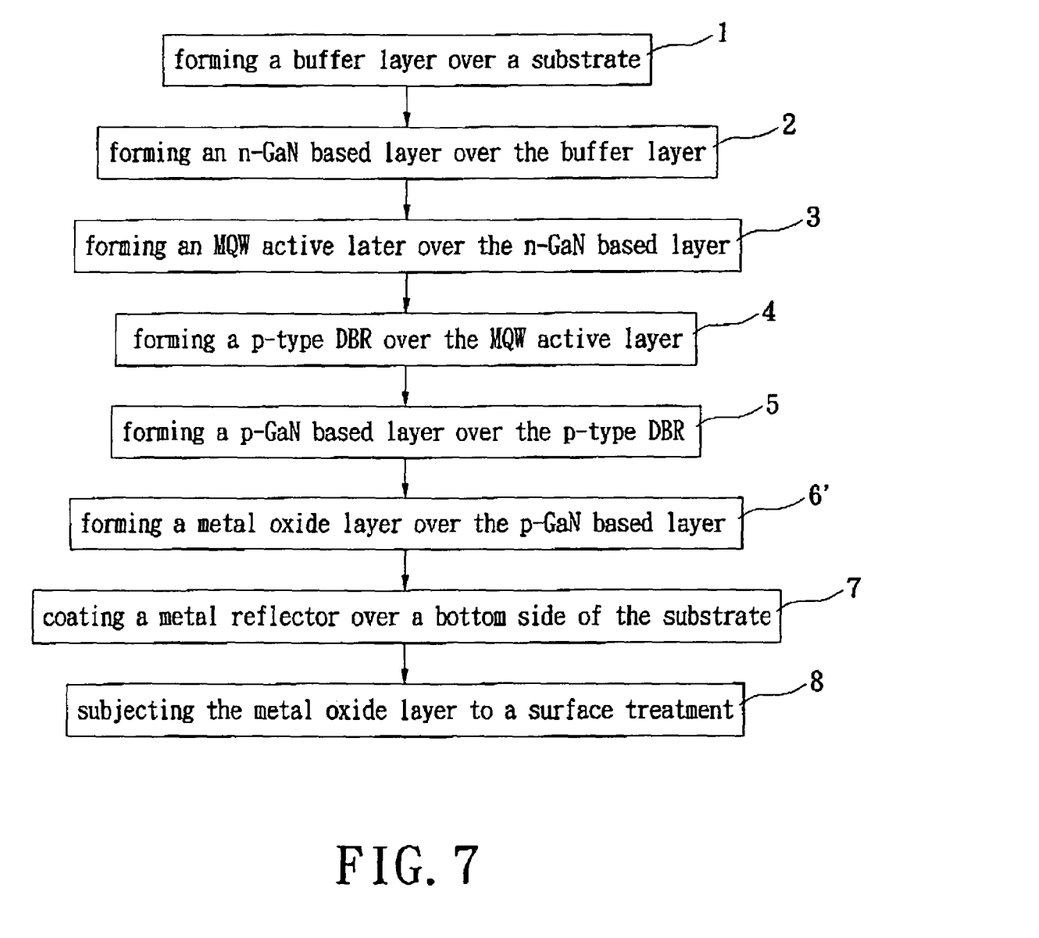
FIG. 7 depicts schematically a manufacturing method of a third embodiment according to the present invention.

Referring to FIG. 7 illustrating a third method embodiment of the present invention, which is composed by adding the second method embodiment with a step, Step 8. Step 8: subjecting the TCL 20 to a surface treatment at its upper surface. Step 8 is executed for minimizing the portions of the generated light back off into the light-emitting structure. The surface treatment applied may be forming a roughened surface or some particularly texturized surface on the TCL surface, and the light extraction efficiency may be increased.

It is to be noted that Step 6' and Step 7 in the second embodiment can be executed in different sequence, and so can Step 6' and Step 7 in the third embodiment.

Figure 8:
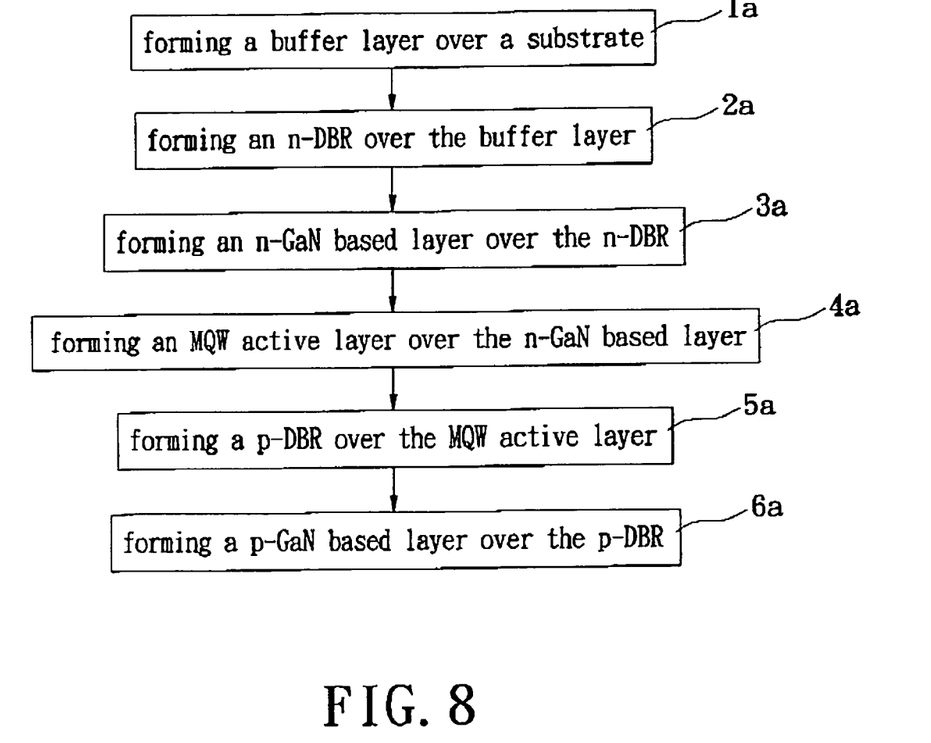
FIG. 8 depicts schematically a manufacturing method of a fourth embodiment according to the present invention.
Figure 9:
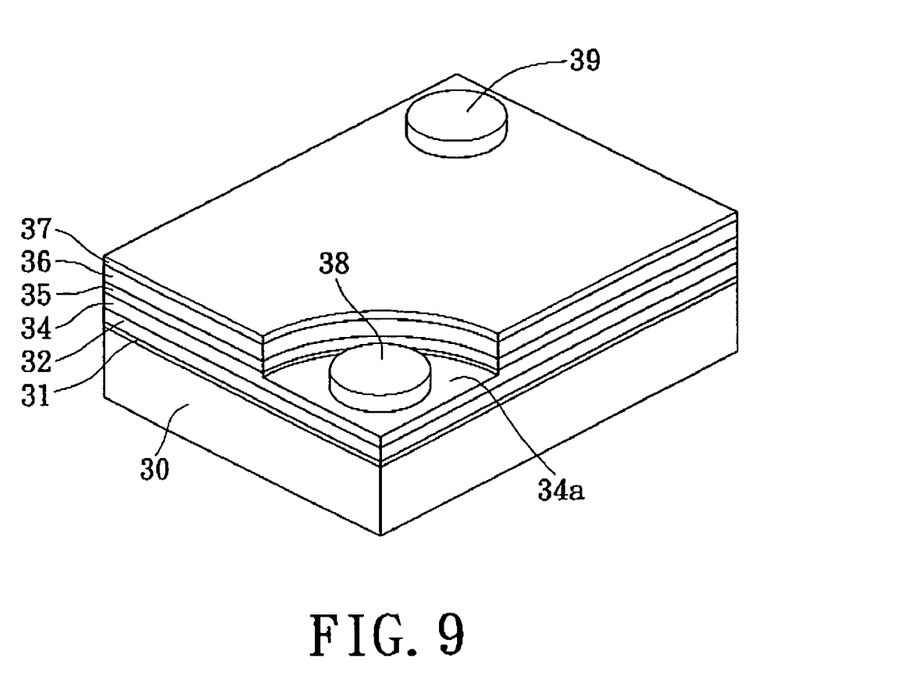
FIG. 9 depicts schematically a perspective diagram of a structure of a fourth embodiment according to the present application.
Figure 9A:
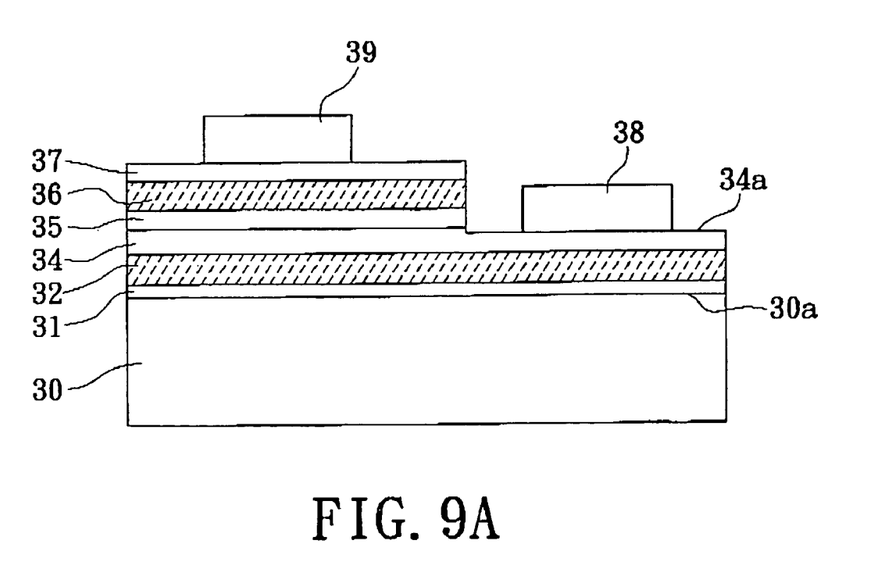
FIG. 9A depicts schematically a structure of a device of the fourth embodiment according to the present application.
Figure 10:
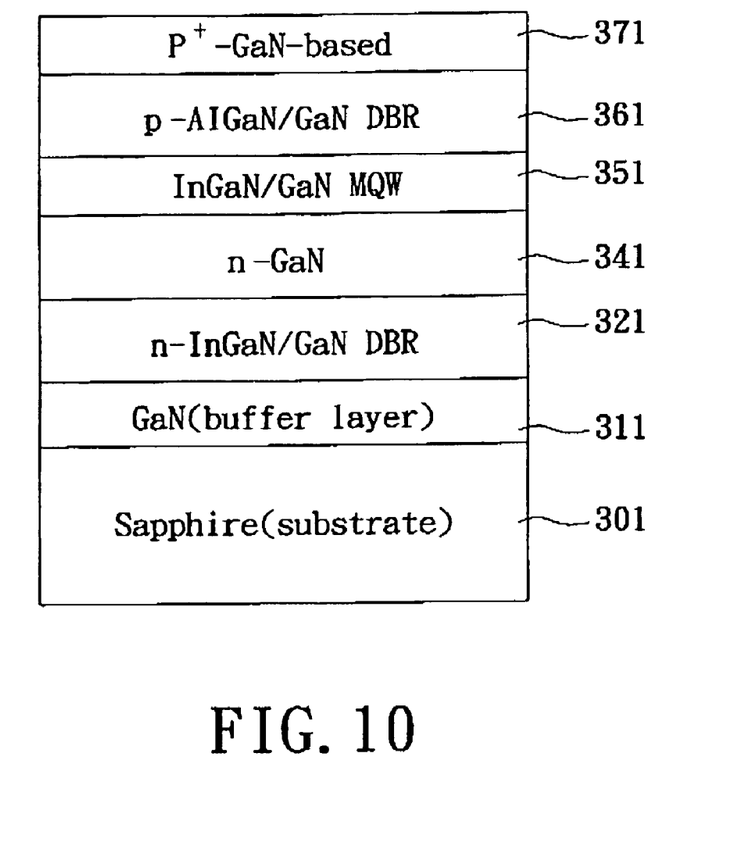
FIGS. 10 and 10A depict schematically a particular example of the epitaxial structure shown in FIG. 9.
Figure 10A:
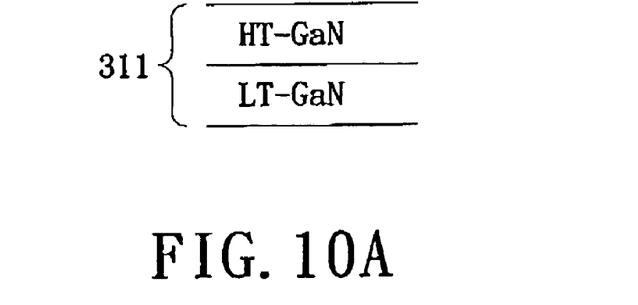

The fourth to the sixth embodiments according to the present invention are different with the former three embodiments in design of the resonant cavity. Referring to FIGS. 8 to 10A, a fourth embodiment according to the present invention is illustrated therein, wherein FIG. 8 shows a method thereof, FIGS. 9 and 9A show a device thereof, and FIGS. 10 and 10A are a particular example of the device shown in FIGS. 9 and 9A. In the embodiment, an n-DBR layer 32 is used as the lower reflecting component in replace of the metal reflector in the above-mentioned embodiments, and the method comprises the following steps.

Step 1a: forming a buffer layer 31 over a substrate 30, i.e., forming a buffer layer 31 over an upper surface 30a of the substrate 30. The substrate 30 may be such as sapphire, SiC or GaN. Step 2a: forming an n-DBR 32 over the buffer layer 31. Step 3a: forming an n-GaN based layer 34 over the n-DBR 32. Step 4a: forming an MQW active layer 35 over the n-GaN layer 34, wherein the MQW active layer 35 is chosen so that the layer 35 may emit a light having a wavelength of 380–600 nm. Step 5a: forming a p-DBR 36 over the MQW active layer 35. Step 6a: forming a p-GaN based layer 37 (for example, a p-GaN layer, a p-InGaN layer or a p-AlInGaN layer) over the p-DBR 36 and etching away a portion of the n-GaN based layer 34, the MQW active layer 35, the p-DBR 36 and the p-GaN layer 37, whereby an exposing region 34a is formed on the n-GaN based layer 34, an n-type electrode 38 may be disposed over the exposing region 34a, and a p-type electrode 39 may be disposed over the p-GaN layer 37. In the method embodiment, the n-type DBR and the p-type. DBR are chosen below 90% in reflectance.

The device of the fourth embodiment according to the present invention, FIGS. 9 and 9A, includes a substrate 30, an n-DBR 32, an n-GaN layer 34, an MQW active layer 35, a p-DBR 36, a contact layer 37, an n-type metal electrode 38 and a p-type electrode 39.

As compared to the former three embodiments, the fourth device embodiment is different in the resonant cavity, which is formed between the n-DBR 34 and the p-DBR 36 (the metal reflector 19 and the p-DBR 15 in the afro-mentioned embodiments), and the substrate 30 is not included in the resonant path. In this case, the substrate 30 may be transparent or not transparent, such as silicon, which is contrary to the transparent substrate 10 in the above embodiments.

Referring to FIGS. 10 and 10A, a particular example of FIGS. 9 and 9A is shown there. In the example, the first and second layer 311 is an LT-GaN/HT-GaN buffer layer, the third layer 321 is an n-AlGaN/GaN DBR, the fourth layer 341 is an n-GaN semiconductor layer having a thickness of 2–6 µm, the fifth layer 351 is an InGaN/GaN MQW layer, the sixth layer 361 is a p-AlGaN/GaN DBR and the seventh layer 371 is a p+-GaN based semiconductor layer having a thickness of 0.2–0.5 µm. These epitaxial layers are formed over the substrate 301 having a thickness of 300–500 µm.

Figure 11:
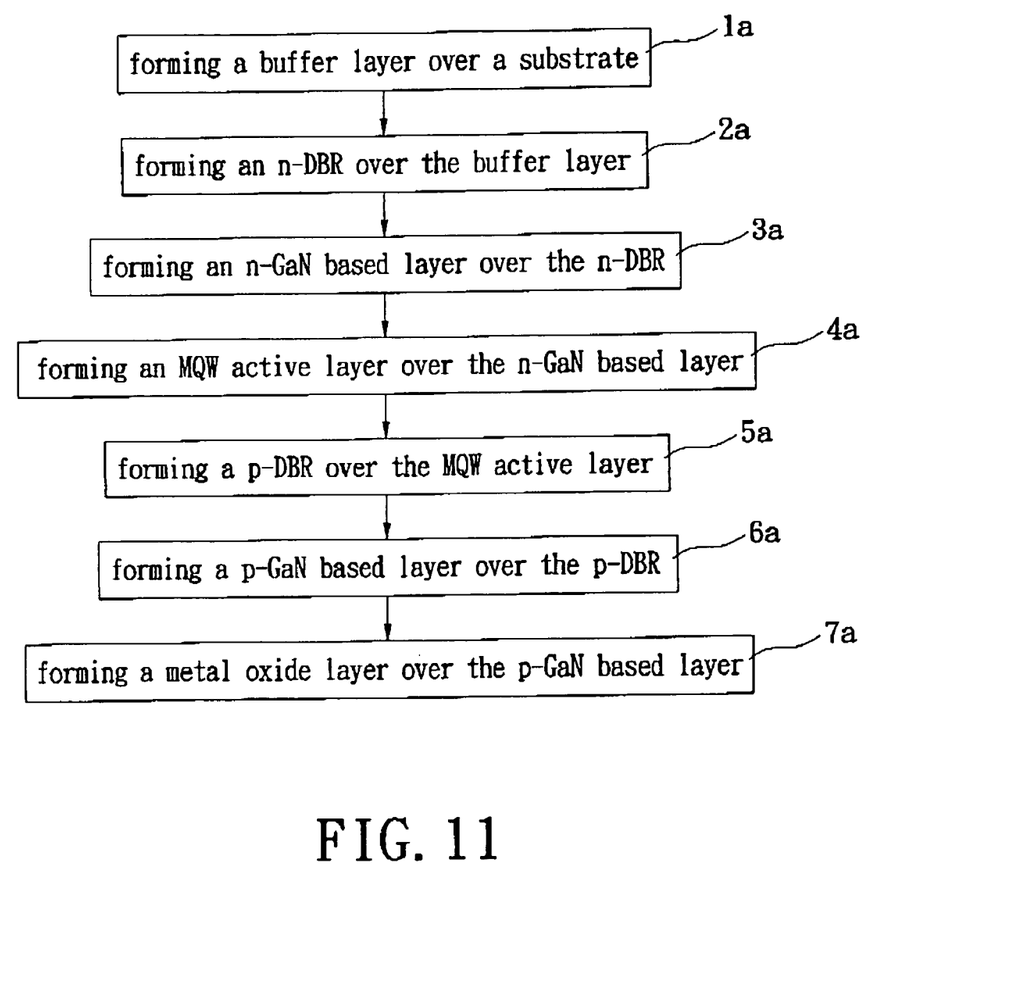
FIG. 11 depicts schematically a manufacturing method of a fifth embodiment according to the present invention.
Figure 12:
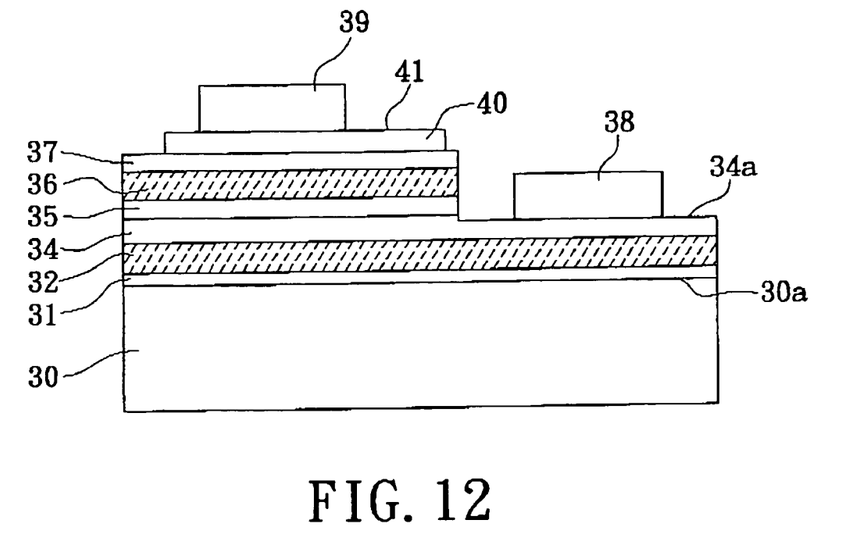
FIG. 12 depicts schematically a structure of a fifth embodiment according to the present invention.
Figure 13:
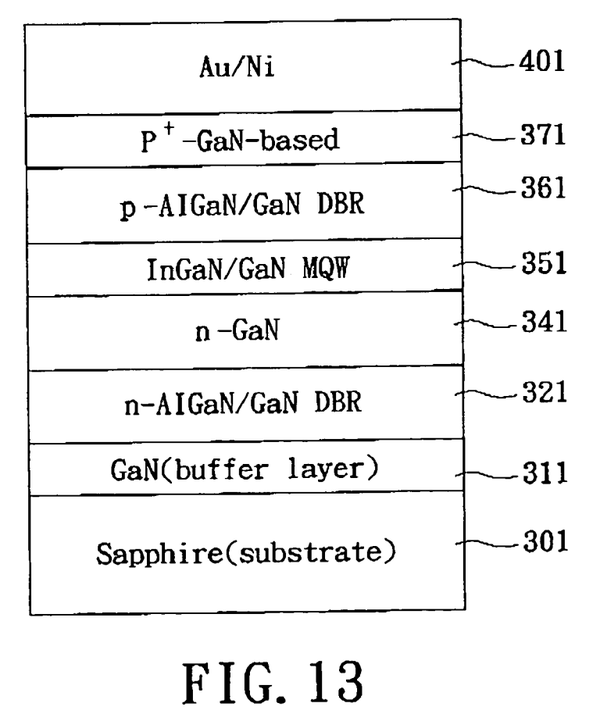
FIG. 13 depicts a particular example of the epitaxial structure shown in FIG. 12.

Referring to FIGS. 11 to 13 illustrating a fifth embodiment according to the present invention. As shown in FIG. 11, the fifth method embodiment has an extra step, Step 7a, as compared to the fourth embodiment. Step 7a: forming a metal oxide layer 40 over the p-GaN layer 37, wherein the layer 40 has a suitable thickness and is transparent to a visible light having a wavelength of such as 380–600 nm. FIG. 12 shows a fifth device embodiment of the present invention, which corresponds to the method in FIG. 11. As mentioned in the above, some metal oxides may be used as the TCL. Accordingly, Step 7a provides such a TCL.

Referring to FIG. 13, it illustrates a particular example of the fifth embodiment. In the example, all layers are the same as the corresponding ones in the fourth embodiment except for the ZnO metal oxide layer 401, which may also be Al doped ZnO and has a thickness of 50 Å–50 µm.

It is to be noted that the metal oxide 40 may further be $In_xZn_{1-x}O$, $Sn_xZn_{1-x}O$ or $In_xSn_yZn_{1-x-y}O$ based materials, wherein $0 \leq X \leq 1$, $0 \leq Y \leq 1$ and $0 \leq X+Y \leq 1$; or a metal oxide having an index of refraction of at least 1.5; or n-type conductive or p-type conductive metal oxide; or rare earth element doped metal oxide.

Figure 14:
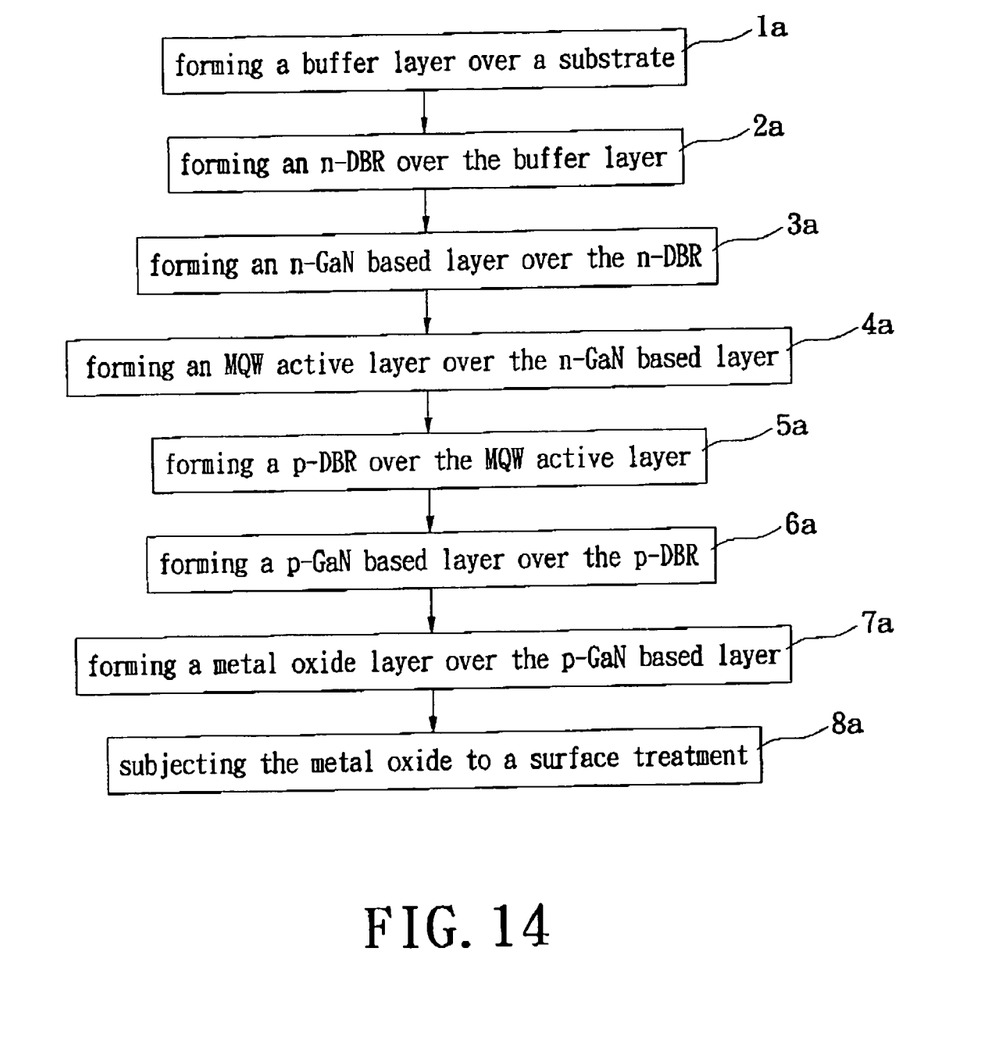
FIG. 14 depicts schematically a structure of a six embodiment according to the present invention.

Referring to FIG. 14 illustrating a sixth embodiment of the present invention. In the embodiment, there is an extra step, Step 8, as compared to the fifth embodiment. Step 8a: subjecting the metal oxide layer 40 to a surface treatment. That is, the region of the metal oxide layer 40 not contacted with the p-type metal 39 is subject to a surface treatment so as to have a roughened surface 41 or a particularly texturized surface.

It is to be noted that the epitaxial layers in the present invention may be formed by self-texturing by sputtering, physical vapor deposition, ion plating, pulsed laser evaporation, chemical vapor deposition, molecular beam epitaxy technologies or some other suitable technologies.

While the invention has been described by way of example and in terms of preferred embodiments, it is to be understood that the invention is not limited thereto since those skilled in the art may easily deduce some associated modifications. For example, GaAs may be utilized in the PIN structure of the present invention and render the corresponding light emitting device to emit a red colored light and the corresponding LED as a red colored LED. In fact, the present invention is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a light emitting device of a light-emitting device (LED), comprising:
   (a) forming a buffer layer over an upper side of a substrate, wherein said substrate comprises sapphire, silicon carbide (SiC) and gallium nitride (GaN);
   (b) forming an n-GaN based epitaxial layer over said buffer layer;
   (c) forming an MQW layer over said n-GaN based epitaxial layer, wherein said MQW active layer comprises a material so that said MQW active layer emits a light with a wavelength comprising 380 nm to 600 nm in response to an applied electric power on said light-emitting structure;
   (d) forming a p-type distributed Brag reflector (DBR) over said MQW active layer;
   (e) forming a p-GaN based layer over said p-type DBR, etching away a portion of said n-GaN based layer, said MQW active layer, said p-type DBR and said p-GaN based layer whereby said n-GaN based layer has an exposing region and disposing an n-type electrode over said exposing region and a p-type electrode over said remaining p-GaN based layer after said etching; and
   (f) coating a metal reflector over a bottom side of said substrate.

2. The method as in claim 1, wherein a step of (e') is added in said step (e) after said forming and prior to said disposition of said n-type and said p-type electrodes, said step (e') is forming a transparent contact layer (TCL) having an exposing side, wherein said TCL comprises Ni/Au and other transparent and conductive layers with a suitable thickness and being transmittable with a light having a wavelength ranging from 380 nm to 600 nm.

3. The method as in claim 2, wherein said p-type DBR comprises AlGaN/GaN.

4. A method for manufacturing a light-emitting structure of a light-emitting device (LED), which comprises the steps of:
   (a) forming a buffer layer over an upper side of a substrate wherein said substrate comprises sapphire, silicon carbide (SiC), silicon (Si) and gallium nitride (GaN);
   (b) forming an n-type DBR on said buffer layer;
   (c) forming an n-GaN based layer over said n-type DBR;
   (d) forming an MQW active layer over said n-GaN based layer, wherein said MQW active layer comprises a material so that said MQW active layer emits a light with a wavelength of 380–600 nm upon an applied electric power;
   (e) forming a p-type distributed Brag reflector (DBR) over said MQW active layer; and
   (f) forming a p-GaN based layer over said p-type DBR and etching away a portion of said p-GaN based layer, said p-type DBR, said MQW active layer and said n-GaN based layer whereby said n-GaN based layer has an exposing region and disposing an-type electrode over said exposing region of said n-GaN based layer and disposing a p-type electrode over said p-GaN based layer,
   wherein the light-emitting structure between the n-type DBR and the p-type DBR includes the n-GaN based layer formed directly on the n-type DBR, the MQW active layer formed directly on the n-GaN based layer, and the D-type DBR forming the formed directly on the MQW active layer.

5. The method according to claim 4, wherein a step of (f') is added in said step (f) after the forming and prior to the disposition of said n-type and said p-type electrodes, said step (f') is forming a transparent contact layer (TCL) with a suitable thickness and being transparent to a light with a wavelength of 380–600 nm over said etched p-GaN layer, wherein said TCL having an exposing side.

6. The method according to claim 4, wherein said n-type DBR has a reflectance of greater than 90% and said p-type DBR has a reflectance of 50–80%.

* * * * *